United States Patent [19]

Hausman et al.

[11] Patent Number: 5,262,974
[45] Date of Patent: Nov. 16, 1993

[54] PROGRAMMABLE CANONIC SIGNED DIGIT FILTER CHIP

[75] Inventors: John C. Hausman, Torrance; Robert R. Harnden, Manhattan Beach; Etan G. Cohen, Los Angeles, all of Calif.; Harold G. Mills, Ithaca, N.Y.

[73] Assignee: TRW Inc., Redondo Beach, Calif.

[21] Appl. No.: 783,731

[22] Filed: Oct. 28, 1991

[51] Int. Cl.⁵ .............................................. G06F 7/52
[52] U.S. Cl. .................... 364/746.2; 364/760
[58] Field of Search ............... 364/746.2, 760, 724.16

[56] References Cited

U.S. PATENT DOCUMENTS

| | | | |
|---|---|---|---|
| 4,121,295 | 10/1978 | Witt | 364/746.2 |
| 4,638,449 | 1/1987 | Frey | 364/746.2 |
| 4,843,582 | 6/1989 | Heck et al. | 364/746.2 |
| 4,967,388 | 10/1990 | Tate | 364/760 |
| 5,081,604 | 1/1992 | Tanaka | 364/724.16 |
| 5,115,408 | 5/1992 | Darley et al. | 364/746.2 |

OTHER PUBLICATIONS

Ulbrich et al, "MOS-VLSI Pipelined Digital Filters for Video Applications", *ICAASP* 84 *Proceeding* Mar. 19-21, 1984 vol. 1 pp. 44.7.1-44.7.4.

Primary Examiner—David H. Malzahn
Attorney, Agent, or Firm—Ronald L. Taylor

[57] ABSTRACT

A programmable canonic signed digit (CSD) filter is provided which employs programmable CSD multipliers. The filter receives a digital input signal and includes a tapped delay line for providing a delay between the input samples. The filter advantageously employs a plurality of programmable CSD multipliers which receive programmable input filter coefficients and perform multiplication of the coefficient with the delayed input signal. Summation hardware is further included for summing the outputs of the plurality of multipliers to provide the filter output therefrom.

18 Claims, 11 Drawing Sheets

PROGRAMMABLE CANONIC SIGNED DIGIT FILTER CHIP

BACKGROUND OF THE INVENTION

1. Technical Field

This invention relates to digital filtering systems and, more particularly, to an FIR digital filter having programmable canonic signed digit (CSD) multipliers.

2. Discussion

Digital filters are widely used in various applications for processing digital signals. Digital filters are generally constructed from electronic devices such as adders, multipliers, shift registers, memory units and so on. For applications with narrow transition bandwidths and highly suppressed stopband attenuation, digital filters generally require that many filter taps be implemented in a finite impulse response (FIR) configuration. However, the many filter taps that are required for typical FIR filter configurations, which traditionally have been implemented with full array twos complement multipliers, may drive hardware requirements to such a high level as to become practically unrealizable.

To overcome this problem, a technique referred to as a canonic signed digit (CSD) implementation has been developed which significantly reduces the hardware requirements. A CSD filter implementation employs a special number representation technique which simplifies the hardware required for multiplication operation. Each filter coefficient of a CSD filter is essentially represented as the sum of a small number of powers of two weighted by $+1$ or $-1$.

In operation, a CSD filter performs multiplication which is accomplished in hardware with a relatively small number of shifts, negations and additions. This implementation requires far less circuitry than a typical two's complement array multiplier. However, the coefficients for a CSD filter are hardwired to provide a fixed filter which restricts the implementation to a single filter response configuration. As a result, such a filter is configured to provide a fixed filtering response based on fixed filtering coefficients. The fixed coefficients thereby restrict the use of the CSD filter to one particular filtering application which results in an inflexible filter.

It is therefore desirable to obtain a more flexible and compact digital filter which employs a programmable CSD multiplier that allows for a wide range of filter responses. It is further desirable to obtain a programmable and more compact canonic signed digit (CSD) array multiplier.

SUMMARY OF THE INVENTION

In accordance with the teachings of the present invention, a programmable canonic signed digit (CSD) filter is provided. The filter includes an input port for receiving a digital input signal having a plurality of digitized samples. A tapped delay line is connected to the input port for providing a delay between each of the digitized samples of the digital input signal. The filter further employs a plurality of programmable canonic signed digit (CSD) multipliers for receiving programmable filter coefficients and multiplying the outputs of the tapped delay line with the filter coefficients. The outputs of the programmable CSD multipliers are then summed together to provide a filter output signal therefrom.

BRIEF DESCRIPTION OF THE DRAWINGS

The various advantages of the present invention will become apparent to those skilled in the art by reading the following specification and by reference to the following drawings in which.

DETAILED DESCRIPTION OF THE PREFERRED EMBODIMENT

Figure 1A:
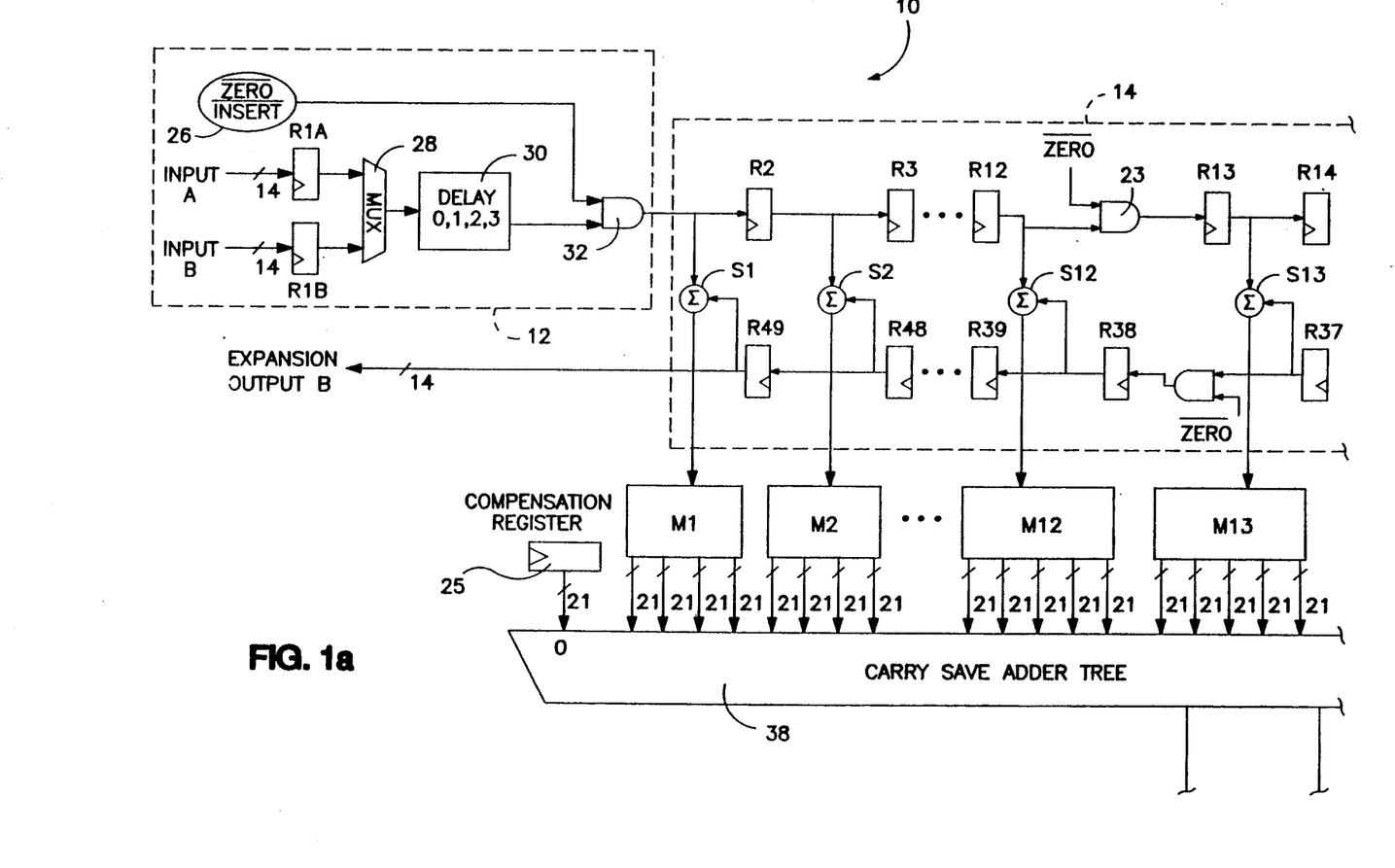
FIGS. 1a–1c are a block diagram which illustrates a programmable CSD filter in accordance with the present invention.
Figure 1B:
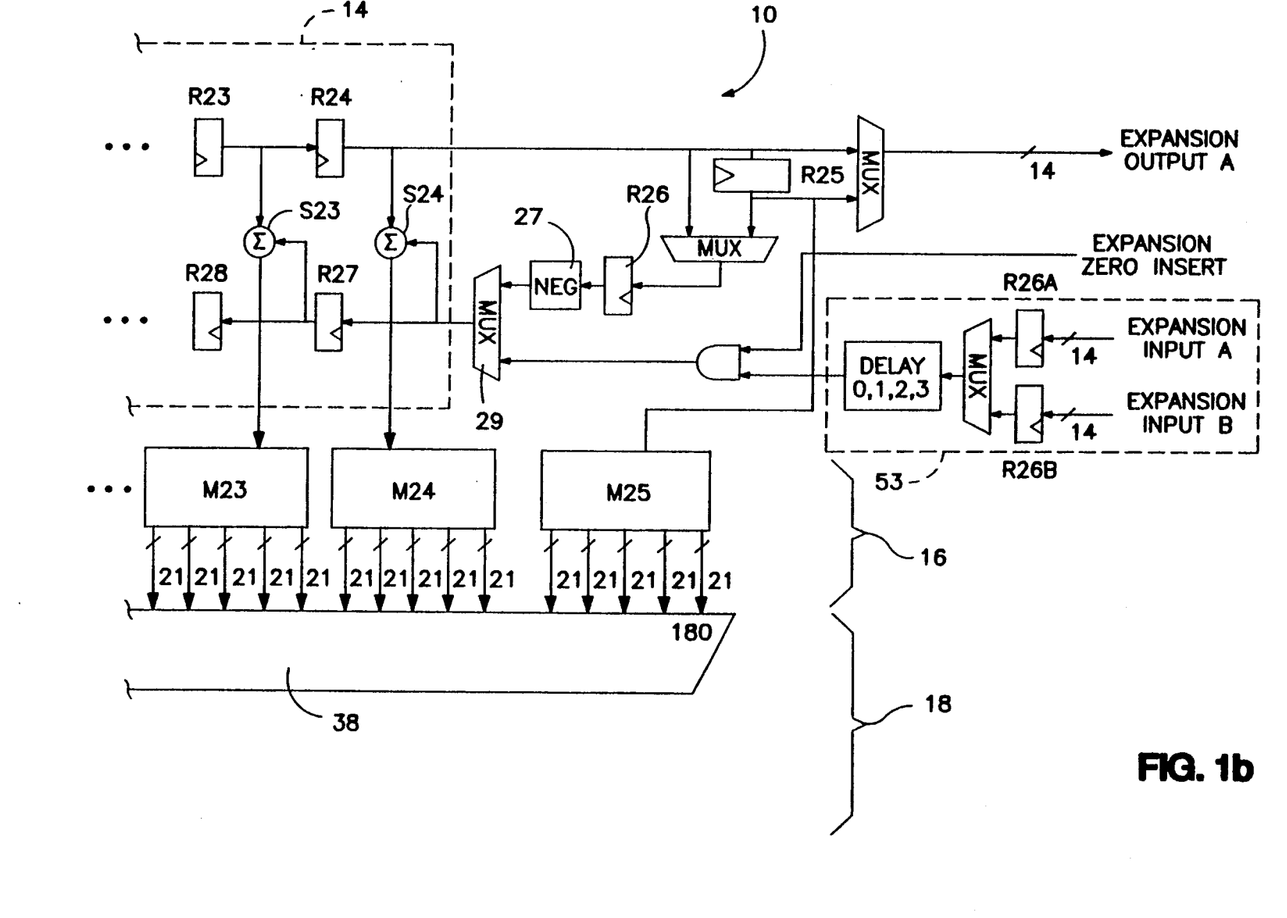
Figure 1C:
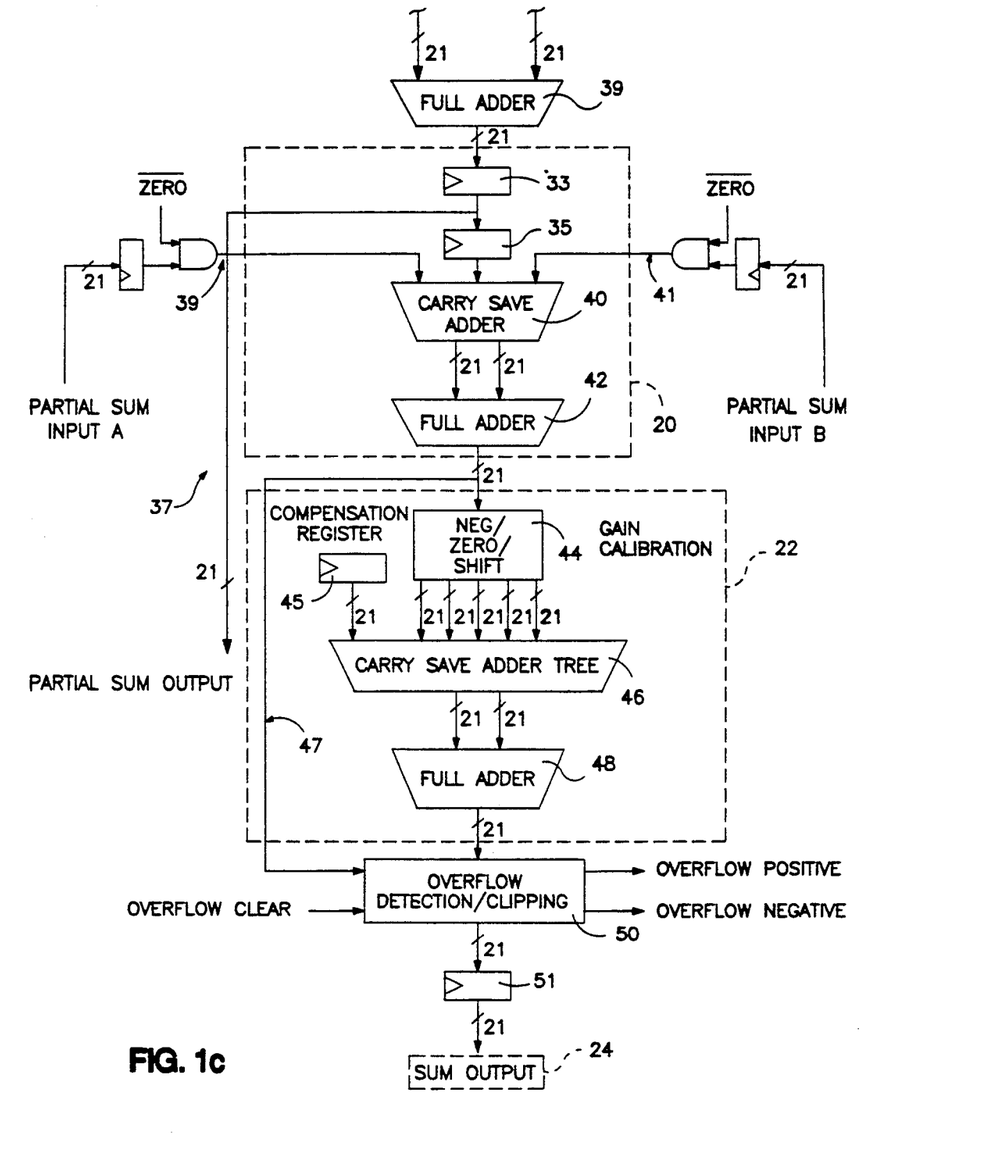

Turning now to FIG. 1, a programmable canonic signed digit (CSD) filter 10 in accordance with the present invention is shown therein. The filter 10 is configured as a digital finite impulse response (FIR) filter which implements a programmable canonic signed digit (CSD) approach. The hardware for the filter 10 shown in FIG. 1 is provided on a single application specific integrated circuit (ASIC) filtering chip.

The filter 10 includes an input terminal 12 for receiving a digital input signal. A tapped delay line 14 having forty-nine filter taps is connected to the input terminal 12. The tapped delay line 14 receives the digital input signal and provides the necessary delay between each digitized sample of the digital input signal. The tapped delay line 14 then provides a plurality of delayed signals as outputs thereof.

Multiplication hardware 16 is provided which includes a plurality of programmable CSD multipliers M1–M25. The CSD multipliers M1–M25 are connected to the outputs of the tapped delay line 14. Each of the multipliers M1–M25 receives an input from one of the outputs of the tapped delay line 14. Each of the programmable CSD multipliers M1–M25 multiplies the input by a filter coefficient and provides an output therefrom. The programmable CSD multipliers 16 are programmable, thereby allowing the filter coefficients to be set by the operator. The programmable capability thus allows the implementation of a wide range of filter responses upon loading a set of filter coefficients therein.

Summation hardware 18 is connected to the outputs of the programmable CSD multipliers M1–M25 for summing the outputs of the programmable CSD multipliers M1–M25. The summation hardware 18 includes a carry save adder tree 38 having a pair of outputs connected to a full adder 39 which provides a summation output. A compensation register 25 is further connected to the summation hardware 18 for allowing adjustment of any constant offset.

Cascade hardware 20 is connected to the output of the summation hardware 18. The cascade hardware 20 allows for a plurality of filter chips to be cascaded together, thus allowing the implementation of additional filter taps. The cascade hardware 20 includes a pair of registers 33 and 35 connected in series. A partial sum output 37 is tapped from the first register 33 which allows the output to be cascaded with another filter chip. In addition, the cascade hardware 20 provides a carry save adder 40, which receives the output of the register 35 and partial sum inputs 39 and 41 from other filtering chips. The cascade hardware 20 further provides a full adder 42 for summing the pair of outputs provided by the carry save adder 40.

A gain calibration circuit 22 is further provided and is connected to the output of the cascade section 20. The gain calibration circuit 22 provides the filter 10 with the capability to adjust the magnitude of the output signal such that an arbitrary gain may be achieved with any set of filter coefficients. The gain calibration circuit 22 includes a programmable CSD multiplier 44, summation hardware, and a compensation register 45. The summation hardware includes a carry save adder tree 46 and a full adder 48 which are provided for summing the output of the programmable CSD multiplier 44 with the value stored in the compensation register 45.

Connected to the output of the gain calibration circuit 22 is an overflow detection/clipping device 50 for providing commandable detection of arithmetic overflow at the output of the full adder 42 (via path 47) or full adder 48. The overflow detection/clipping device 50 further allows samples for which overflow has been detected to be forced to maximum positive or negative value at the output of the overflow detection clipping device 50. The overflow detection/clipping device 50 includes a clipping overflow indicator clear input port and positive and negative overflow output indicators in addition to the sample output. A register 51 is further provided having an output terminal 24 connected thereto for providing a digital filter output response signal therefrom.

The input terminal 12 as shown in FIG. 1 includes a pair of input ports A and B. The filter 10 is adapted to receive a digital signal from one of the input ports A or B. The second input port is optional and essentially allows for ease of reconfiguration of multiple chips. Input ports A and B are connected to registers R1A and R1B, respectively. The input ports A and B are adapted to receive 14-bit binary coded digital input signals. However, the filter 10 may be configured to receive larger or smaller bit size input signals without departing from the scope of this invention.

The outputs of registers R1A and R1B are applied to a multiplexer 28. The multiplexer 28 provides a single output path which is connected to a delay 30. The output of the delay 30 undergoes a logical AND operation with a zero insert control signal 26 by way of a 14-bit wide block of AND gates 32. The Zero insert control signal 26 in combination with the block of AND gates 32 essentially provide the ability to force the digital input samples received by the filter 10 to a value of zero. For purposes of this invention it is only necessary to provide a single digital input signal.

Figure 2A:
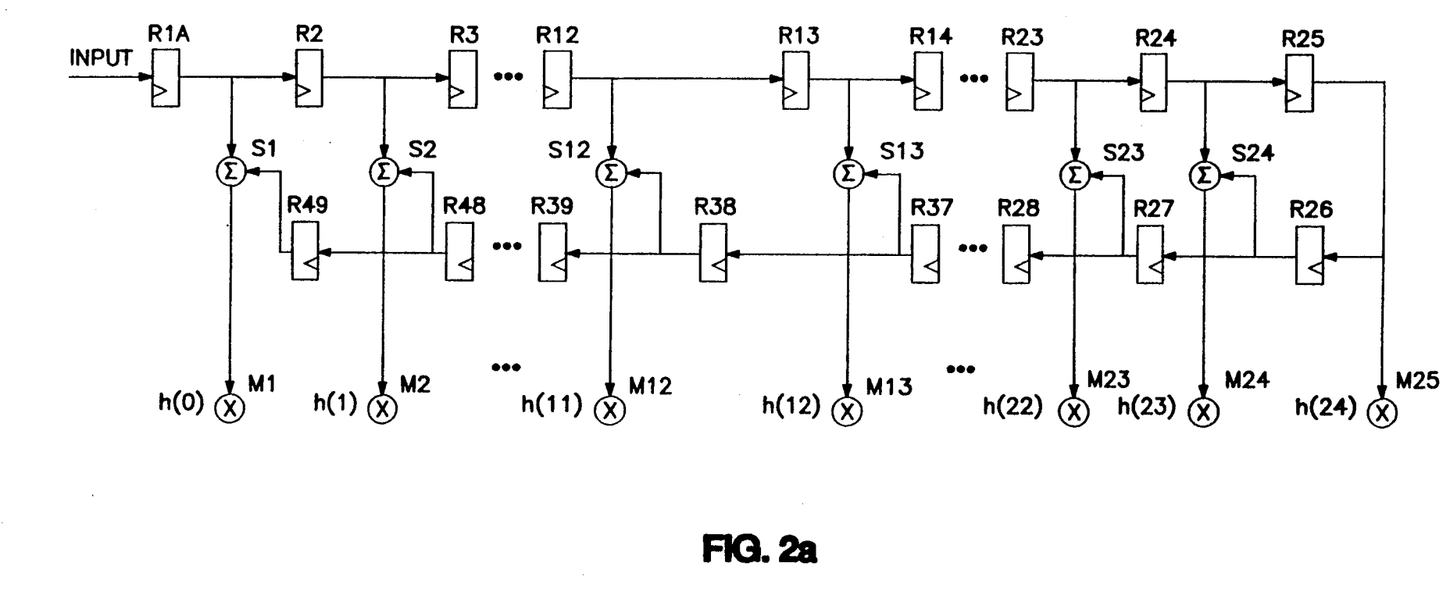
FIG. 2a is a block diagram which illustrates a tapped delay line for a Symmetric Single Input (SSI) Mode having an odd length.

The tapped delay line 14 for a filter 10 is shown in detail in FIGS. 2a through 2e. In general, the tapped delay line 14 as shown in FIG. 2a employs hardware which includes a plurality of registers R1 through R49 and a plurality of summers S1 through S24. The registers R1 through R49 provide a series of delays between each of the digital samples of the input signal. As a result, the forty-nine shift registers R1 through R49 provide forty-nine filter taps.

The particular tapped delay line configuration shown allows efficient implementation of even or odd length symmetric FIR filter designs, i.e. the first coefficient is the same as the last, the second coefficient is the same as the second to last and so on. In doing so, the first sample of the digital input signal is tapped from the first tap in register R1 and is summed by summer S1 with the last sample which is tapped from the last tap in register R49. The summed output is also provided to the first programmable CSD multiplier M1. Similarly, the output of the second sample of the digital input signal is tapped from the second tap in register R2 and is summed by summer S2 with the second to last sample which is tapped from the second to last tap in register R48. The output is likewise provided to the second programmable CSD multiplier M2. This mode of operation as shown in FIG. 2a is referred to as Symmetric Single Input (SSI) Mode since the filter coefficients must be symmetric and the filter 10 receives one input sample on each clock cycle. The example above assumes an odd filter length, such that the center coefficient applied to CSD multiplier M25 is unique. When the filter length is even, register R25 is bypassed and the coefficient for CSD multiplier M25 is set to a value of zero. This results in the tapped delay line architecture shown in FIG. 2b.

Filters which are even or odd length and have odd symmetry, that is, $h(0) = -h(N-1)$, $h(1) = -h(N-2)$ and so on, may be implemented using the negation logic block 27 shown on the output of register R26 in FIG. 1. The negation logic block 27 multiplies the delayed input data samples by $-1$ before entering the lower portion of the tapped delay line 14, allowing the highly efficient Symmetric Single Input Mode to be used.

The filter 10 may be implemented without the symmetric configuration shown. As such, the filter would eliminate the summers S1 through S24 but would require the addition of the same number of multipliers. The symmetric configurations of FIGS. 2a and 2b advantageously allow for the elimination of twenty-four multipliers at a cost of adding the same number of adders. Because multipliers are generally much larger than adders, the symmetric configuration advantageously provides a significant reduction in the size of the filter 10, thereby enabling a greater number of filter taps for a given chip size.

Figure 2B:
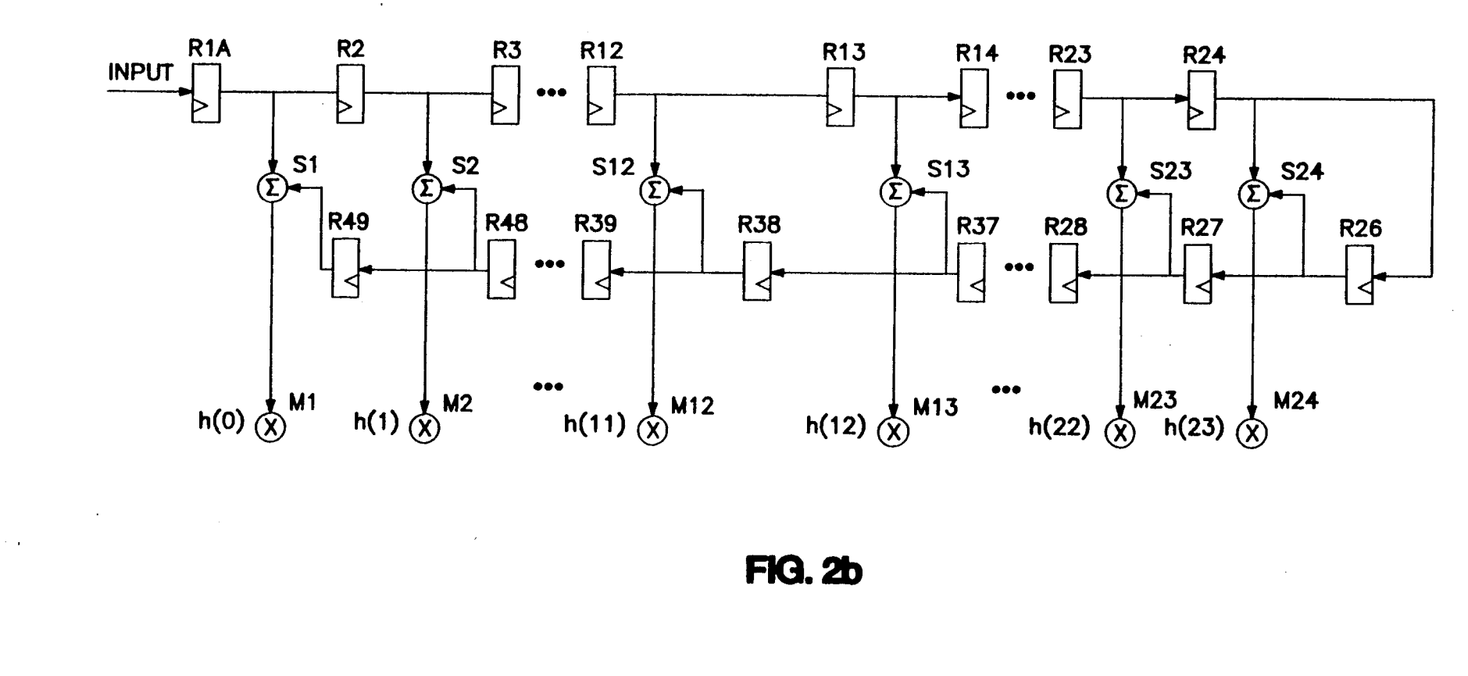
FIG. 2b is a block diagram which illustrates a tapped delay line for a Symmetric Single Input mode having an even length.
Figure 2C:
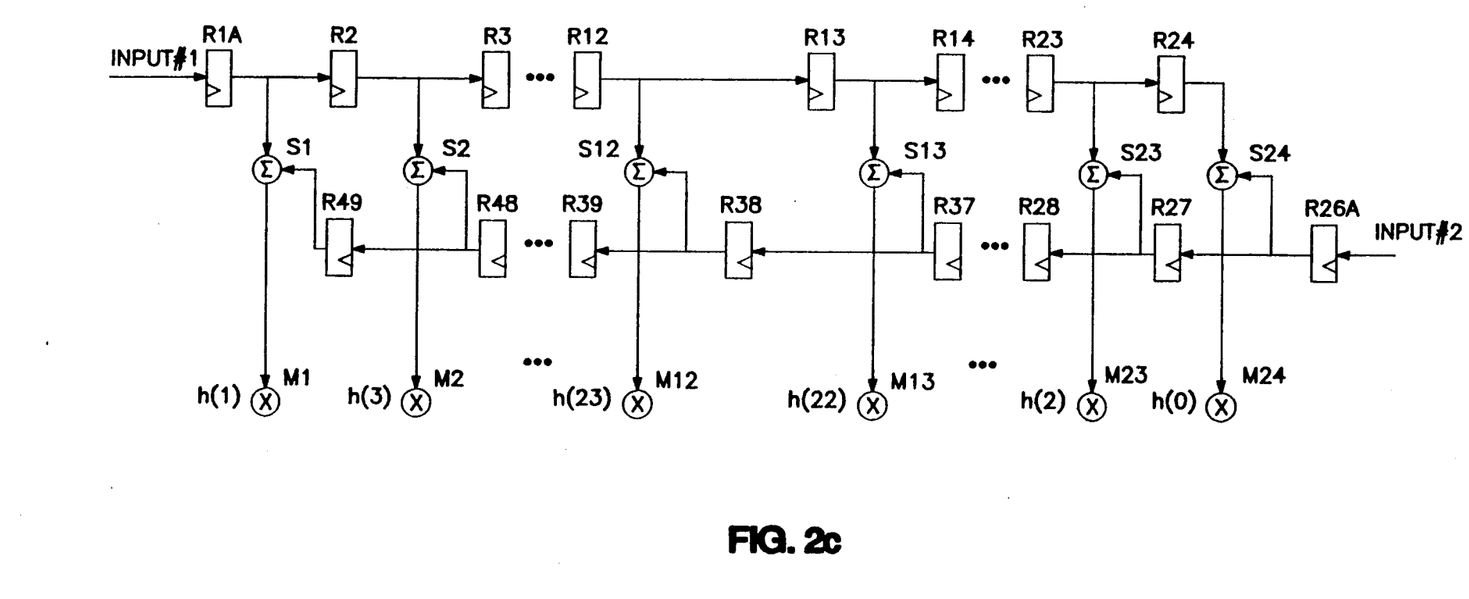
FIG. 2c is a block diagram which illustrates a tapped delay line for a Symmetric Dual Input (SDI) mode having an even length.
Figure 2D:
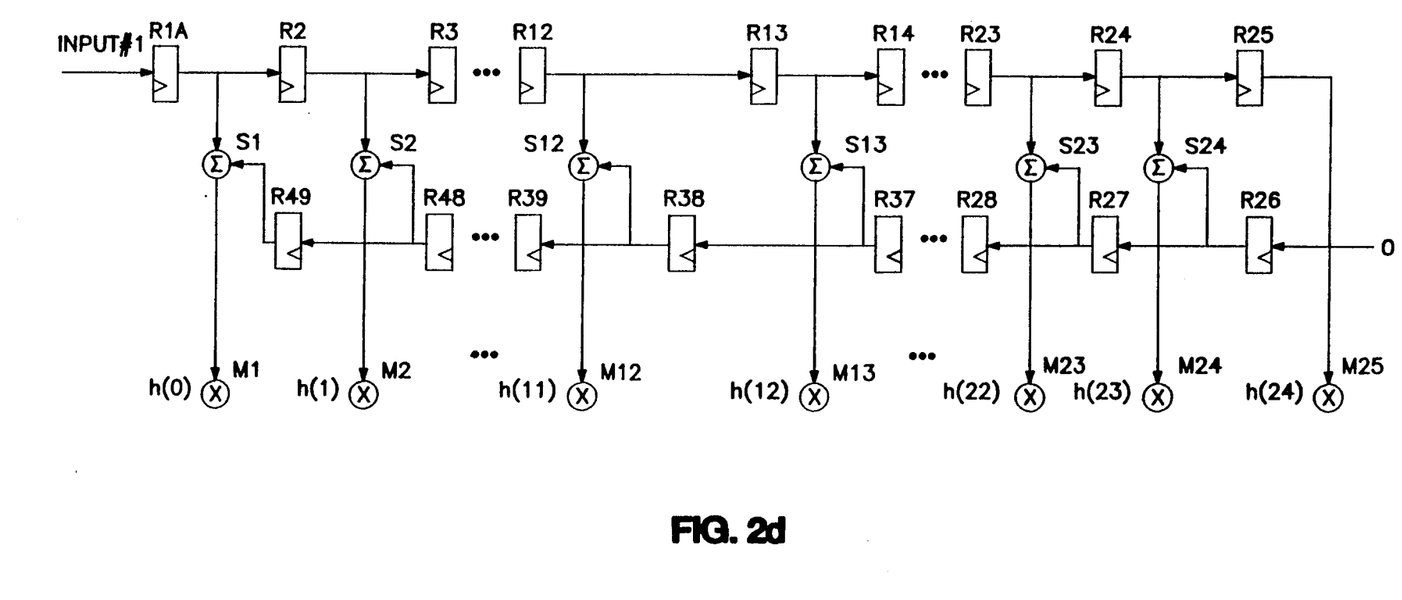
FIG. 2d is a block diagram which illustrates a tapped delay line for an Asymmetric Single Input (ASI) mode having an even or odd length.

When the filter coefficients do not have the required symmetry to implement the Symmetric Single Input Mode shown in FIGS. 2a or 2b, the tapped delay line 14 may be reconfigured to the Asymmetric Single Input (ASI) configuration of FIG. 2d. In the Asymmetric Single Input configuration, input data is applied as before, but the multiplexer 29 feeding summer S24 as shown in FIG. 1 is set to accept data from the expansion input port 53. If the data applied to the expansion input port 53 is then set equal to zero, summers S1 through S24 will add zero to the delayed samples from the upper portion of the tapped delay line 14.

The Symmetric Dual Input (SDI) Mode shown in FIG. 2c is used for symmetric, even-length filter designs where it is desired to generate only one output sample for every two input samples. This effectively allows the architecture to process input data at twice the maximum clock rate of the filter 10. This implementation requires that the input data sequence be demultiplexed; that is, input data samples 1, 3, 5, . . . are applied to input #1, while samples 2, 4, 6, . . . are applied to input #2. If it is desired to generate one output for every input, two filters may be placed in parallel with slightly different coefficients.

Figure 2E:
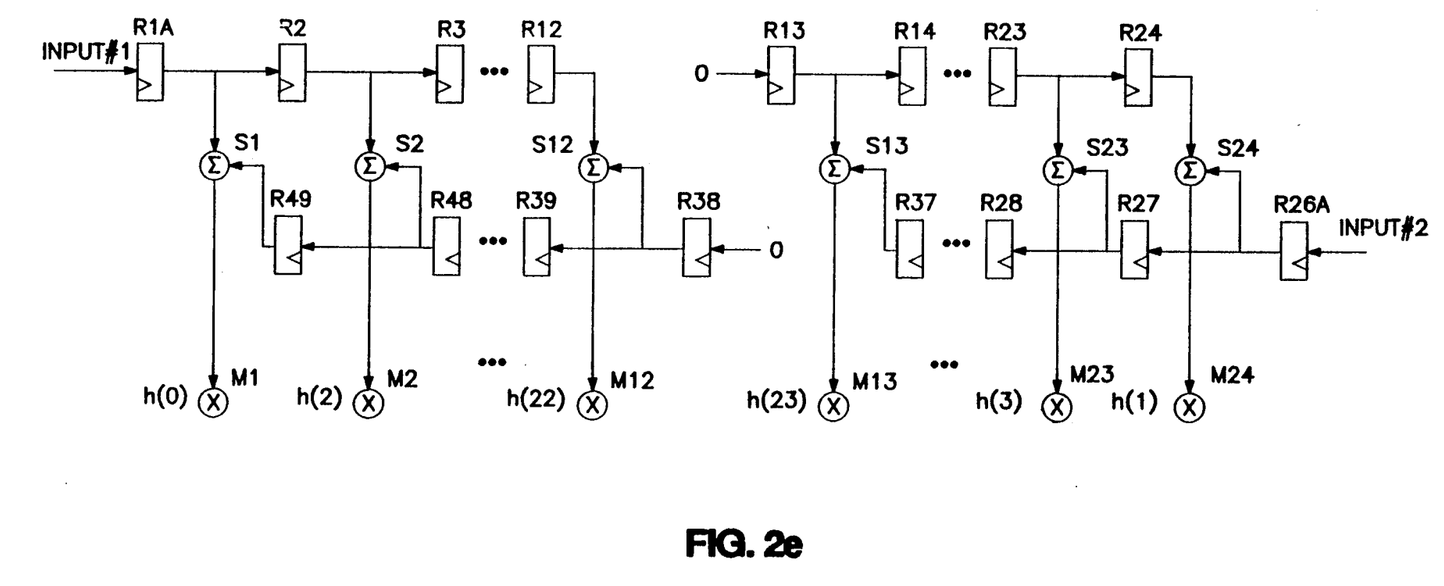
FIG. 2e is a block diagram which illustrates a tapped delay line for an Asymmetric Dual Input (ADI) mode.

If the desired filter design is not symmetric, and it is desired to generate only one output sample for every two input samples, the Asymmetric Dual Input (ADI) Mode of FIG. 2e is used. In this mode, input data samples are demultiplexed as in the Symmetric Dual Input mode. However, the upper portion of the tapped delay line 14 is broken after register R12 and a zero is then applied to the register R13 input using the 14 bit wide AND logic block 23 shown in FIG. 1 between registers R12 and R13. Similarly, the lower portion of the tapped delay line 14 is broken after register R37, with zero applied to the register R38. Thus, summers S1 through S12 will add zero to the data samples in the upper delay line, while summers S13 through S24 add zero to the data samples in the lower portion of the tapped delay line 14.

A summary of the tapped delay line operating modes is illustrated in Table I below:

TABLE I

| Mode | FIG. | Filter Symmetry Required? | Filter Length Restriction? | Number of Inputs on Each Clock | Maximum Number of Filter Taps (using 1 IC) |
|---|---|---|---|---|---|
| SSI | 2A | yes | odd length | 1 | 49 |
| SSI | 2B | yes | even length | 1 | 48 |
| SDI | 2C | yes | even length only | 2 | 24 |
| ASI | 2D | no | even or odd length | 1 | 25 |
| ADI | 2E | no | even or odd length | 2 | 12 |

Figure 3:
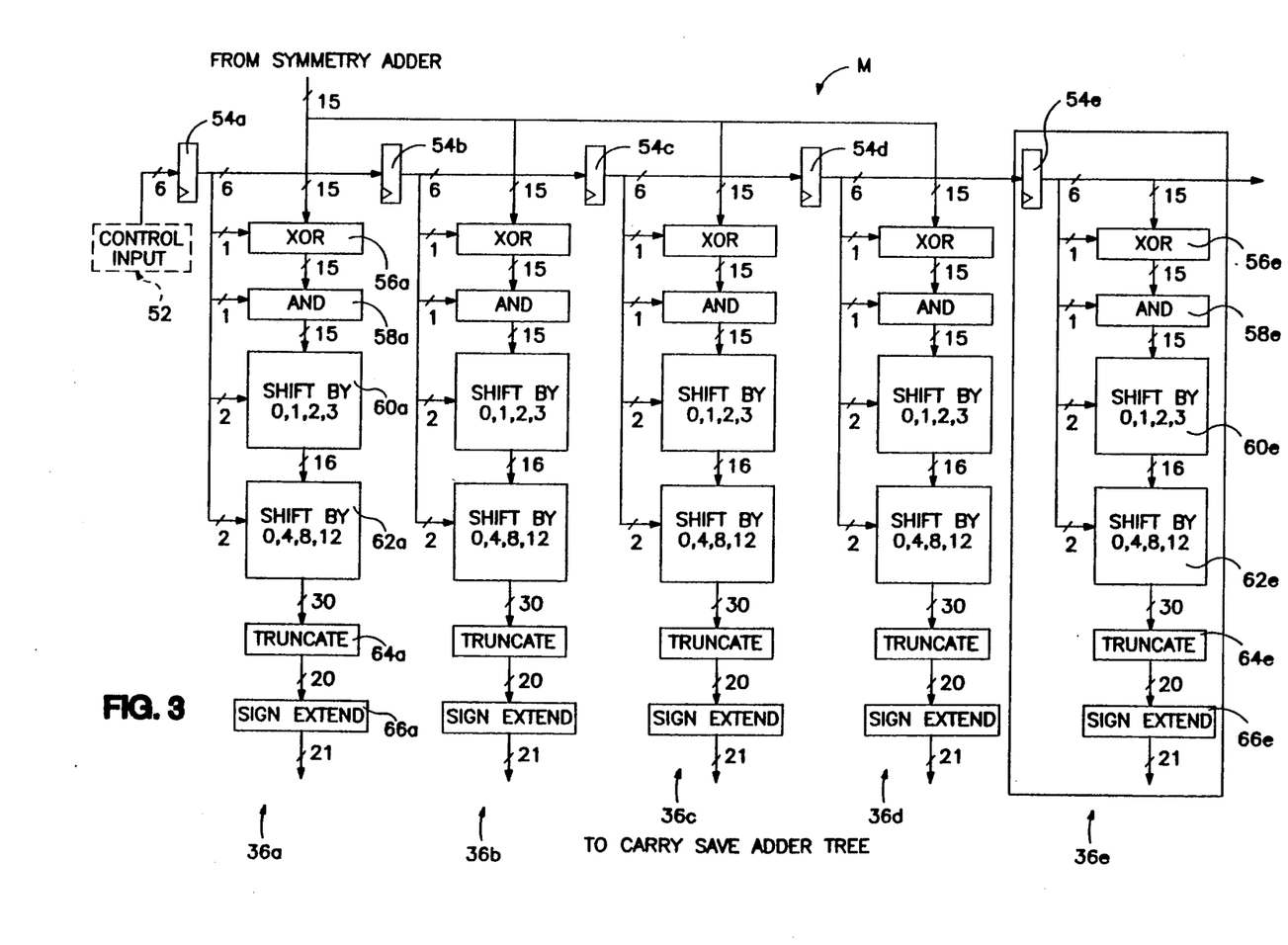
FIG. 3 is a block diagram which illustrates a programmable CSD multiplier in accordance with the present invention.

One of the programmable CSD multipliers M1–M25 is shown in FIG. 3. The programmable CSD multiplier M includes five programmable shift paths 36a through 36e. As such, the programmable CSD multiplier M is generally capable of providing five outputs or partial products, which when summed produce the final CSD multiplier result. More or less programmable shift paths 36 may be employed depending on desired precision which increases with more programmable shift paths 36. The programmable CSD multiplier M includes a control input 52 which allows a series of 6-bit binary command words to be provided by the operator. In this example, five binary command words constitute one CSD multiplier coefficient. The filter coefficient is provided to and stored in the coefficient registers 54a through 54e.

The programmable CSD multiplier M receives the summation output from the corresponding summer S. The summation output, a 15-bit word, is applied to each programmable shift path 36a–36e. The programmable CSD multiplier M then performs multiplication of the summation output with the filter coefficient which is accomplished in hardware with a small number of shifts, negations and additions.

The first bit of the filter coefficient and the summation output are provided to a 15-bit wide block of XOR logic gates 56. The block of XOR logic gates 56 allows the ones complement of the input to be formed. This is required in order to implement CSD weightings of −1. The output of the block of XOR logic gates 56 is then logically ANDed with the next bit of the control input 52 by a 15-bit wide block of logic AND gates 58. The block of AND gates 58 thereby allows the output of the block of XOR gates 56 to be forced to a value of zero. This is required in order to implement CSD weighting of zero, or to disable multiplier paths which are not needed for a specific filter implementation. The output of the block of AND gates 58 as well as the next two bits of the control input 52 are provided to a first multiplexer 60. The first multiplexer 60 is a 4-to-1 multiplexer which performs the operation of shifting by either 0, 1, 2 or 3 bit positions left. The output of the first multiplexer 60 as well as the next two bits of the control input 52 are provided to a second multiplexer 62. The second multiplexer 62, likewise, is a 4-to-1 multiplexer which provides for a shift by 0, 4, 8 or 12 bit positions left. The output of the second multiplexer 62 may include 30 bits which provides the programmable shift path output. The programmable shift path output is then terminated by a truncate 64 which passes the 20 most significant bits of the shifter 62 to a sign extend 66. The sign extend 66 replicates the most significant bit and provides the resulting programmable shift path output to be applied to the carry save adder tree 38.

The operation of multiplying by −1 in twos complement arithmetic requires essentially two steps. The first step is to logically invert all data bits (i.e. ones complement). The second step is to add a one at the least significant bit position. When implementing a CSD weighting of −1, the first step is performed in the CSD multiplier M by inverting all data bits in the appropriate programmable shift path before shifting. However, the second operation is not performed in each shift path. Instead, the constant values that would have been added for each negative CSD weighting across all CSD multipliers M1 through M25 are accumulated into a single constant value and placed into the compensation register 25 as shown in FIG. 1. (The value is computed for each unique filter design and is programmed into the compensation register 25 each time that a new set of filter coefficients is loaded). A similar compensation register 45 is provided at the gain calibration multiplier 44.

The values stored in compensation register 25 may be further modified to cancel any constant offset introduced by the truncation operation performed by truncates 66a through 66e in FIG. 3, in order to provide a pseudo-rounding operation. The value stored in compensation register 45 may be similarly modified to provide true rounding of the filter output to any precision less than the full output precision.

The summation hardware 18 then sums the outputs of each of the programmable CSD multipliers M1 through M25 with the carry save adder 38. The output of the carry save adder 38 is then provided to a full adder 39 which provides the total summation thereof.

The optional cascade function 20 essentially allows for two or more filter chips to be cascaded together by breaking the tapped delay line 14 of one filter chip in its middle and extending it with the tapped delay line 14 of one or more other filter chips. The partial sums produced by the filter chips are then combined in one of the filter chips at the bottom of the chip's adder tree 42 to provide the final multi-chip filter output. In principle, P number of filter chips having a length N delay line, may be cascaded to yield a P(N−1)+1 tapped structure for any number of P chips. Cascading of more than three filter chips will require additional external summation hardware.

Figure 4:
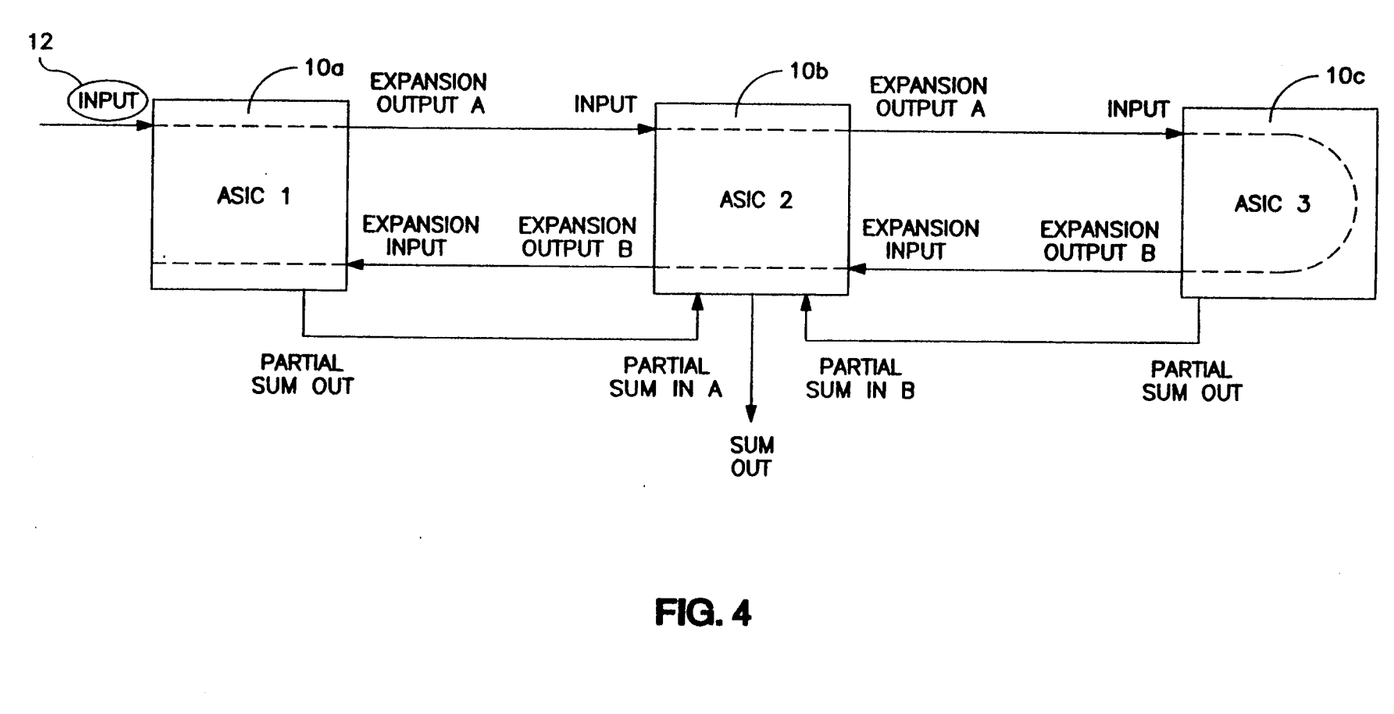
FIG. 4 is a block diagram which illustrates a plurality of cascaded filter chips.
Figure 5:
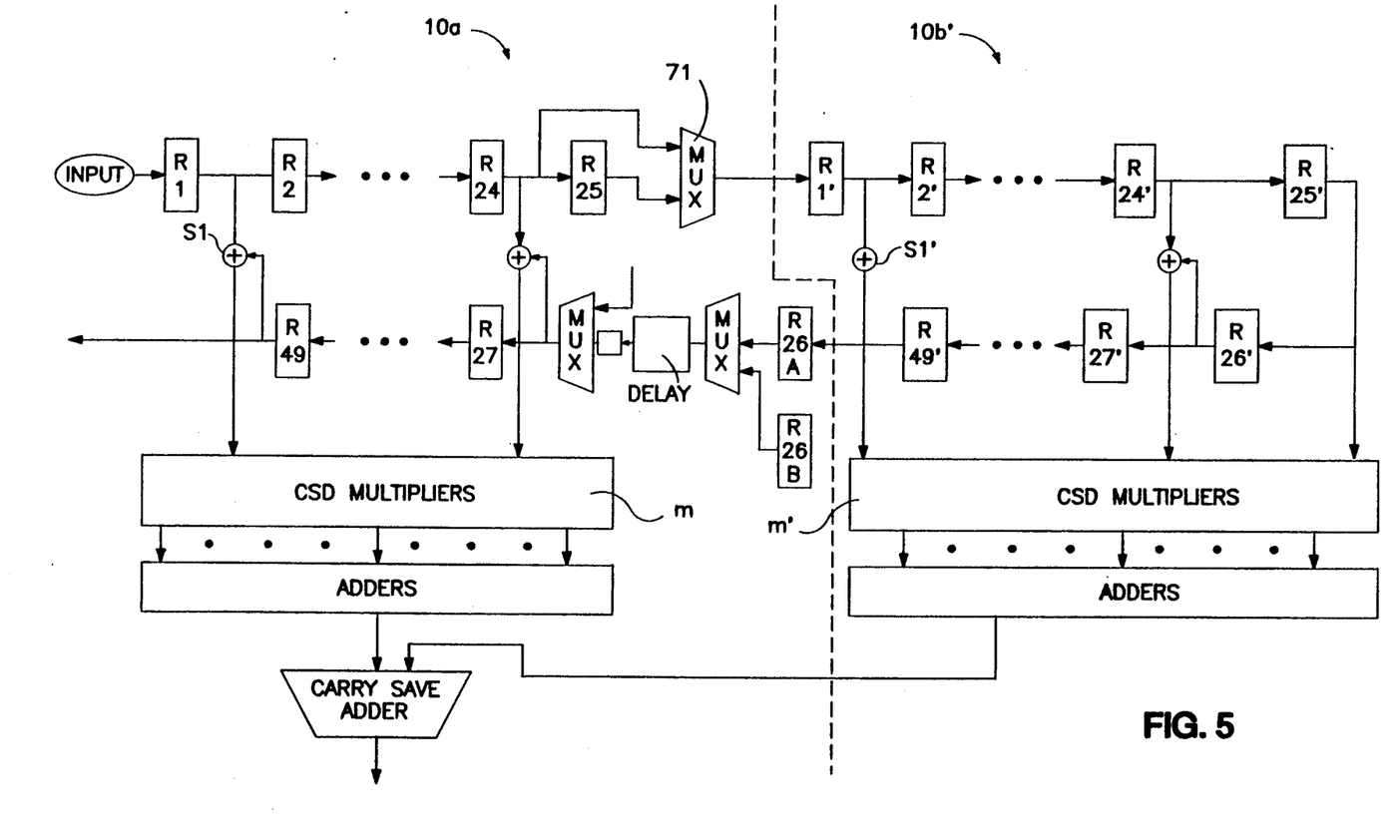
FIG. 5 is a block diagram which illustrates two filter chips cascaded together.

FIGS. 4 and 5 illustrate the cascading of filter chips. FIG. 4 shows a plurality of application specific integrated circuit (ASIC) filter chips 10a-10c cascaded together. The filter chip 10a receives an input signal at input terminal 12. The tapped delay line of filter 10a is broken and interconnected with the tapped delay line of filter 10b'. As such, either register R24 or R25 of filter 10a is essentially connected to the register R1' of filter 10b' through a multiplexer 71. The register R49' of filter 10b' is then connected to register R26A of filter 10a. Similarly, filter 10b and filter 10c are connected. Filters 10a and 10c each produce a partial sum output which is provided to filter 10b. The partial sum outputs of filters 10a and 10c are summed together with the output of filter 10b to produce the final multi-chip filter output response.

In view of the foregoing, it can be appreciated that the present invention provides a programmable CSD filter employing programmable CSD multipliers which enables the user to achieve a more flexible CSD filter. Thus, while this invention has been disclosed herein in connection with a particular example thereof, no limitation is intended thereby except as defined by the following claims. This is because the skilled practitioner will recognize that other modifications can be made without departing from the spirit of this invention after studying the specification and drawings.

What is claimed is:

1. A Finite Impulse Response (FIR) digital filter comprising:
    input means for receiving a digital input signal having a plurality of digitized samples;
    delay means having a plurality of delay taps and being connected to said input means for providing a delay between each of said samples;
    first adder means including a plurality of full adders for summing selected pairs of said delayed samples;
    multiplication means including a plurality of programmable canonic signed digit (CSD) multipliers, each of said CSD multipliers receiving a summed sample output from said first adder means and having a plurality of programmable shift paths for multiplying said received output from said first adder means by a programmable filter coefficient so as to generate partial product outputs, wherein said filter coefficient is represented by a variable number of ternary canonic signed digits and wherein each of said programmable shift paths multiplies one of said ternary digits by said summed sample and includes a first logic means for providing a ones complement of the summed sample in each multiplier shift path if said one ternary digit has a negative sign and second logic means for setting the summed sample in an associated shift path to zero so as to disable said associated shift path when not needed; and
    second adder means for summing the partial product outputs of said plurality of programmable CSD multipliers to thereby provide a filter output response.

2. The filter as defined in claim 1 wherein said plurality of programmable CSD multipliers each further comprises:
    first input means for receiving said programmable input filter coefficient which is encoded as a sum of a plurality of ternary digits; and
    second input means for receiving a summed sample from an output of said first adder means.

3. The filter as defined in claim 2 wherein said plurality of programmable CSD multipliers each further comprises:
    shifter means including at least one multiplexer for shifting the summed sample in each multiplier path so as to form a partial products thereof in each shift path;
    means for truncating said partial products; and
    means for sign extending the truncated partial products.

4. The filter as defined in claim 1 wherein:
    said delay means comprises a plurality of tapped delay units for receiving said digitized samples and providing delays therebetween; and
    said first adder means comprises a plurality of adders for summing said selected pairs of delayed samples so as to generate a plurality of pairs of summed samples.

5. The filter as defined in claim 4 wherein the tapped delay units comprise a chain of registers, each register temporarily storing a sample, wherein given N registers and M selected pairs, an Mth selected pair comprises the output of the Mth register and the (N−M)th register so that the outputs of the first and last register are coupled to one adder to form one selected pair.

6. The filter as defined in claim 1 further comprising:
    a compensation register programmed with the summation of all carry-bits for said multiplier shift paths and connected to said second adder means for loading said summation of carry-in bits into said second adder means along with said partial product outputs to provide a single summation output.

7. The filter as defined in claim 6 wherein said compensation register further provides cancellation of negative bias resulting from any truncation of said partial products and rounds the summation output to a reduced output precision by adding one to the most significant bit which is left unused and truncating the unused bits at the summation output.

8. The filter as defined in claim 1 wherein said tapped delay line has N taps and includes first and second delay lines each having N/2 taps, said first delay line connected to a first dedicated input and said second delay line having a logic means which accepts samples from one of an output from said first delay line and a second dedicated input, said first and second dedicated inputs employed simultaneously to implement a filter of an even length of up to N which has filter coefficients having even symmetry so that one output is generated for every two input samples, wherein:
    each digitized input sample is assigned a time index corresponding to the order each sample is applied to said filter; and
    input samples are separated into first and second sequences, said first sequence having odd indexed samples which are applied to said first dedicated input and said second sequence having even indexed samples which are applied to said second dedicated input and said delay line is programmed to accept input samples from the first and second dedicated input.

9. The filter as defined in claim 8 wherein said tapped delay line further comprises:
logic means for setting latter halves of the first and second delay lines to zero so as to implement a filter having a length of up to N/2 where N is an even number so that one output sample is generated for every two input samples.

10. The filter as defined in claim 8 wherein said tapped delay line further comprises:
logic means for setting the input to the second delay to zero so as to implement a filter having a length of up to N/2 taps where N is an even number so as to generate one output sample for every input sample wherein all input samples are applied in sequence to said first dedicated input.

11. The filter as defined in claim 1 wherein said filter is fabricated onto a single integrated circuit.

12. The filter as defined in claim 1 wherein said filter includes a plurality of integrated circuit filters cascaded together.

13. A finite impulse response (FIR) digital filter comprising:
input means for receiving a digital input signal having a plurality of binary samples;
a tapped delay line having a plurality of taps connected to said input means for providing a delay between said samples and further including a plurality of adders for summing selected pairs of delayed samples;
multiplication means including a plurality of programmable canonic signed digit (CSD) multipliers connected to said tapped delay line, each of said programmable CSD multipliers receiving a programmable filter coefficient and multiplying said filter coefficient with one of said summed pair of samples from said tapped delay line via separate programmable shift paths so as to generate partial product outputs, each of said programmable shift paths having logic means including an XOR gate operating on each data bit of said binary samples for inverting each data bit so as to form a ones complement of the input to the associated programmable shift path when desired, said logic means further including an AND gate operating on the output of each of said XOR gates to set to zero the output of the programmable shift path associated therewith when desired, and programmable multiplexers for forming a shifted version of the AND gate outputs;
compensation means including a register for storing a sum of necessary carry-in bits for providing twos complement inversion of all programmable shift path outputs which were inverted via said XOR gates; and
adder means including a carry save adder tree for summing the partial product outputs of said plurality of programmable CSD multipliers and said programmed summations of carry-in bits from said compensation means to thereby provide a filter output response.

14. A programmable canonic signed digit (CSD) multiplier comprising:
first input means for receiving a multiplicand input in twos complement binary form;
second input means for receiving a canonic signed digit (CSD) multiplier input having a plurality of ternary digits;
a plurality of programmable shift paths, each shift path receiving said multiplicand input and one of said ternary digits of said multiplier input;
first logic means associated with each of said programmable shift paths and including controllable XOR gates which form the ones complement of said associated multiplicand input when the sign of the associated ternary digit is negative;
second logic means associated with each of said programmable shift paths and including controllable AND gates which force outputs of said XOR gates in said associated path to be set to zero when the associated ternary digit is zero;
third logic means associated with each of said programmable shift paths and including controllable multiplexers which shift outputs of the AND gates according to the binary weighting of the associated ternary digit; and
output means associated with each programmable shift path for providing a partial product output of the multiplicand and multiplier input associated with said path.

15. A plurality of multpliers, each multiplier as defined in claim 14 wherein said plurality of said multipliers are connected to a summation system which further comprises:
a compensation register having a summation of all carry-in bits required to complete twos complement inversion of each partial product output associated with a negative ternary digit; and
a multiple input adder for receiving each of said partial product outputs from the output of said shift paths and the output of the compensation register so as to provide a single summation output.

16. A method for FIR filtering a digital signal comprising:
receiving a plurality of digital samples of said digital signal, each sample having a plurality of bits;
providing time delays between each of said digital samples;
summing selected pairs of said delayed samples;
programming a plurality of programmable canonic signed digit (CSD) multipliers with a filter coefficient having weighted signed digits;
multiplying each of said summed delayed samples in the plurality of programmable canonic signed digit (CSD) multipliers with each of said weighted canonic signed digits in separate multiplier shift paths to generate partial product outputs, wherein said multiplication is accomplished by first forming a ones complement of the summed delayed sample by inverting said bits; and
adding the partial product outputs of said CSD multipliers and a summation of weighted carry-in bits for producing a twos complement inversion of each partial product for which the ones complement was previously formed to thereby provide a filter response.

17. The method as defined in claim 16, wherein the step of summing said delayed samples comprises:
summing the first received sample with the last received sample and the next received samples with the corresponding next to last samples so that received sample L is added to received sample N+1−L, where N is the number of tapped delays and L is an integer.

18. The method as defined in claim 16 wherein said step of multiplying in each CSD multiplier comprises:
 providing said summed delay sample to an array of said multiplier shift paths;
 providing each of said digits of said filter coefficient to one of said multiplier shift paths;
 multiplying said summed delay sample with each said digits in each of said multiplier shift paths; and
 disabling any multiplier shift paths which are not needed.

* * * * *